United States Patent
Nabeta et al.

(10) Patent No.: US 7,592,192 B2
(45) Date of Patent: Sep. 22, 2009

(54) WHITE LIGHT EMITTING DIODE (WHITE LED) AND METHOD OF MANUFACTURING WHITE LED

(75) Inventors: Hiroyuki Nabeta, Hachioji (JP); Hideaki Wakamatsu, Hachioji (JP)

(73) Assignee: Konica Minolta Holdings, Inc., Tokyo (JP)

( * ) Notice: Subject to any disclaimer, the term of this patent is extended or adjusted under 35 U.S.C. 154(b) by 0 days.

(21) Appl. No.: 10/590,589

(22) PCT Filed: Feb. 24, 2005

(86) PCT No.: PCT/JP2005/002979

§ 371 (c)(1),
(2), (4) Date: Aug. 24, 2006

(87) PCT Pub. No.: WO2005/086239

PCT Pub. Date: Sep. 15, 2005

(65) Prior Publication Data

US 2007/0164300 A1 Jul. 19, 2007

(30) Foreign Application Priority Data

Mar. 5, 2004 (JP) .............................. 2004-061931

(51) Int. Cl.
*H01L 21/20* (2006.01)
(52) U.S. Cl. .................. 438/22; 257/E33.076
(58) Field of Classification Search ........... 257/98–100, 257/88, E33.059, E33.061, E23.076, 79–82, 257/E21.002; 438/22–25
See application file for complete search history.

(56) References Cited

U.S. PATENT DOCUMENTS

| 6,277,301 | B1 * | 8/2001 | Hohn et al. ............. 252/301.36 |
| 6,583,071 | B1 * | 6/2003 | Weidman et al. ............. 438/787 |
| 6,600,175 | B1 * | 7/2003 | Baretz et al. ................ 257/100 |
| 7,015,510 | B2 * | 3/2006 | Srivastava et al. ............. 257/84 |
| 7,102,152 | B2 * | 9/2006 | Chua et al. ..................... 257/14 |
| 7,258,816 | B2 * | 8/2007 | Tamaki et al. ......... 252/301.4 F |
| 2003/0222268 | A1 * | 12/2003 | Yocom et al. ................. 257/98 |
| 2004/0072383 | A1 | 4/2004 | Nagahama et al. |
| 2004/0061433 | A1 | 7/2004 | Izuno et al. |
| 2008/0023718 | A1 * | 1/2008 | Yano et al. ..................... 257/98 |
| 2008/0291573 | A1 * | 11/2008 | Murakami et al. .......... 360/135 |

FOREIGN PATENT DOCUMENTS

| JP | 10-163535 | 6/1998 |
| JP | 2002-043624 | 2/2002 |
| JP | 2003327961 A * | 11/2003 |
| WO | WO/98/05078 | 2/1998 |

* cited by examiner

*Primary Examiner*—Nathan W Ha
(74) *Attorney, Agent, or Firm*—Frishauf, Holtz, Goodman & Chick, P.C.

(57) ABSTRACT

Disclosed is a white light emitting diode possessing a phosphor layer to convert blue light into yellow light, provided on a blue light emitting diode, wherein the phosphor layer possesses an inorganic compound containing a phosphor, and particularly a white light emitting diode, wherein this inorganic compound is a phosphor. Also disclosed is a method of manufacturing a white light emitting diode, possessing a step of forming the foregoing phosphor layer made of an inorganic compound containing a phosphor via an aerosol deposition method. A white light emitting diode exhibiting high reliability and longer operating life, which is prepared via use of a blue LED element, can be provided by what is described above.

4 Claims, 1 Drawing Sheet

WHITE LIGHT EMITTING DIODE (WHITE LED) AND METHOD OF MANUFACTURING WHITE LED

This application is the United States national phase application of International Application PCT/JP2005/002979 filed Feb. 24, 2005. This application claims priority from Japanese Patent Application No. 2004-061931 filed on Mar. 5, 2004, which is incorporated hereinto by reference.

TECHNICAL FIELD

The present invention relates to a white light emitting diode (white LED) in which blue light emitted from a blue source; particularly a blue LED element is converted into white light, and a method of manufacturing a white LED.

BACKGROUND

In recent years, a white LED has been brought to attention as a white lighting light source exhibiting high efficiency as well as high reliability, and has already been utilized partly as a small-size low electric power light source. It is commonly known that this kind of LED is a LED in which a blue LED element is covered by a mixture of a yellow phosphor and a transparent resin, and a white LED and a phosphor used for the white LED with this method are disclosed (refer to Patent Documents 1-3).

However, a blue light tends to deteriorate a resin since energy of the blue light is large. Therefore, the resin loses the color by using the white LED having the above-described structure for long duration, whereby the color tone is also changed. Further, in recent years, though there is a move to introduce the development of a white lighting light source by employing a high-energy LED element, the resin is seriously deteriorated in this case since a limited area is exposed to extremely large energy blue light, whereby change of an emission color is caused in an extremely short period of time. There was also a problem such that the emission color tone was shifted to the yellow side, since a heat discharge property of a resin-molded element is poor, whereby temperature rise is easily generated.

(Patent Document 1) Japanese Patent O.P.I. Publication No. 10-163535

(Patent Document 2) WO98/05078; descriptive literature (Patent Document 3) Japanese Patent O.P.I. Publication No. 2002-43624

SUMMARY

The present invention was made on the basis of the above-described situation.

It is an object of the present invention to provide a white LED exhibiting high reliability and longer operating life, which is prepared via use of a blue LED element; particularly a high-energy blue LED element, and a manufacturing method of the same.

BRIEF DESCRIPTION OF THE DRAWINGS

Embodiments will now be described, by way of example only, with reference to the accompanying drawings which are meant to be exemplary, not limiting, and wherein like elements numbered alike in several figures, in which.

DESCRIPTION OF THE PREFERRED EMBODIMENTS

The above object of the present invention is accomplished by the following structures.

(Structure 1) A white light emitting diode possessing a phosphor layer to convert blue light into yellow light, provided on a blue light emitting diode, wherein the phosphor layer possesses an inorganic compound containing a phosphor.

(Structure 2) The white light emitting diode of Structure 1, wherein the inorganic compound is the phosphor.

(Structure 3) The white light emitting diode of Structure 1, wherein the inorganic compound possesses a transparent inorganic oxide.

(Structure 4) The white light emitting diode of Structure 3, wherein the transparent inorganic oxide is an oxide of at least one kind selected from Al, Si, Ti, Ge, P, B, Y, Sn, Pb, Gd, Lu, Sc, In, Mg, Ca, Sr and Ba.

(Structure 5) The white light emitting diode of Structure 3, wherein the transparent inorganic oxide is silica or alumina.

(Structure 6) A method of manufacturing a white light emitting diode possessing a phosphor layer to convert blue light into yellow light, provided on a blue light emitting diode, the method possessing a step of forming the phosphor layer comprising an inorganic compound containing a phosphor via an aerosol deposition method.

(Structure 7) The method of Structure 6, wherein a compound as the phosphor being the inorganic compound is prepared.

(Structure 8) The method of Structure 6, wherein the inorganic compound comprising a transparent inorganic oxide is prepared.

(Structure 9) The method of Structure 6, wherein an oxide of at least one kind selected from Al, Si, Ti, Ge, P, B, Y, Sn, Pb, Gd, Lu, Sc, In, Mg, Ca, Sr and Ba as the transparent inorganic oxide is prepared.

(Structure 10) The method of Structure 6, wherein the transparent inorganic oxide being silica or alumina is prepared.

While the preferred embodiments of the present invention have been described using specific terms, such description is for illustrative purposes only, and it is to be understood that changes and variations may be made without departing from the spirit or scope of the appended claims.

DETAILED DESCRIPTION OF THE INVENTION

Next, a white light emitting diode (white LED) of the present invention, and a method of manufacturing a white LED in the present invention will be further described in detail.

Figure 2:
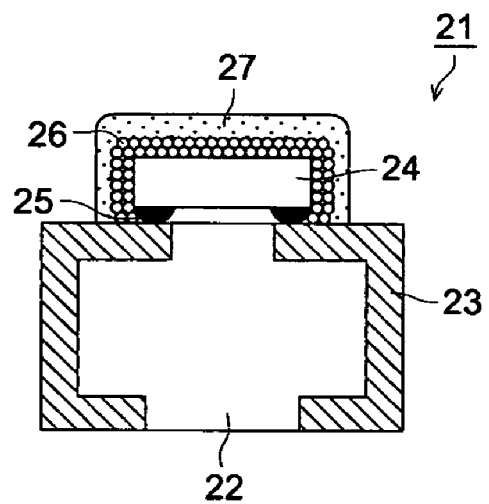
FIG. 2 is a schematic cross-sectional view showing a white LED of the present invention.

FIG. 2 is a schematic cross-sectional view showing white LED 21 of the present invention. After forming bumps 25 on the surface of blue LED chip 24, blue LED chip 24 is turned over to be connected to electrodes 23 on substrate 22 (so-called flip-chip bonding). Phosphor layer 26 is further formed on the blue LED by a film formation method in which phosphor particles of the present invention are deposited via high-speed collision of the particles with the chip surface. Sealing layer 27 made of transparent inorganic oxide may further be formed on phosphor layer 26 as shown in FIG. 2.

Blue light emitting types such as $In_xGa_{1-x}N$, InGaN and ZnO are usable as a blue LED. It is preferred that a blue LED has a light emission peak wavelength is 440-480 nm.

A commercially available phosphor capable of converting blue light emitted from a blue LED into yellow origin light which is greenish yellow (a light emission wave length of about 550 nm), for example is usable as a phosphor. $Y_3Al_{15}O_{12}$ based phosphor such as $(Y, Gd, Ce)_3Al_5O_{12}$ and the like is employed as the most preferable oxide phosphor. An oxide phosphor in which a slight amount of Zn, Ca, Mg, Sr, Sm or Ga is added into $(Y, Gd, Pr)Al_5O_{12}$ or $(Y, Gd, Ce)Al_5O_{12}$ is also employed. Further, a phosphor in which $CaS$, $Ga_2S_3$ or EuS is mixed to be calcined and a phosphor in which divalent Eu is activated to α—SiALON are also employed.

A transparent inorganic oxide other than the foregoing phosphor may be mixed to be used for a phosphor layer of the present invention. Any material is usable if it is an inorganic material transparent to visible light. Specifically, oxide of Al, Si, Ga, Ti, Ge, P, B, Zr, Y, Sn, Pb, Gd, Lu, Sc, In, Mg, Ca, Sr or Ba can be exemplified as the usable transparent inorganic oxide. Of these, $SiO_2$ and $Al_2O_3$ are preferable.

(Process of Forming a Phosphor Layer)

Utilized is a film formation method (so-called aerosol deposition method) in which particles of phosphor or transparent inorganic oxide as a raw material are deposited on a blue LED as a substrate via high-speed collision of the particles with the chip surface, in order to form a phosphor layer in the present invention. The aerosol deposition method has an advantage of high-speed film formation over other vacuum deposition methods. A film formation rate of a sputter deposition method, for example, is at most 0.1 μm/min, but the aerosol deposition method is capable of producing a high-speed film formation rate of 10-30 μm/min.

An aerosol deposition film-forming apparatus disclosed in "OYO-BUTURI" (Vol. 68, No. 1, Page 44) and Japanese Patent O.P.I. Publication 2003-215256 can be utilized.

Figure 1:
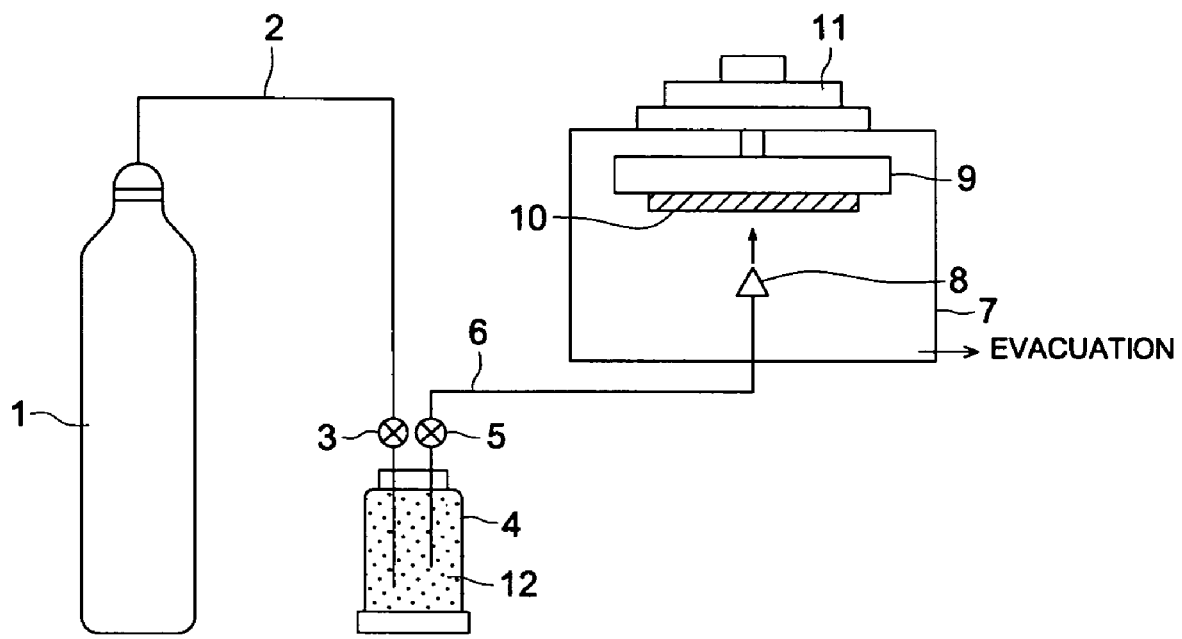
FIG. 1 is a schematic diagram showing an aerosol deposition film-forming apparatus.

FIG. 1 shows a schematic diagram of an aerosol deposition film-forming apparatus used in the present invention. The aerosol deposition film-forming apparatus is equipped with holder 9 supporting substrate 10, XYZθ stage 11 to set the holder 3 in 3 dimensional motion, nozzle 8 having a narrow opening to spray a raw material onto the substrate, nozzle 8 introduced into chamber 7 connected to aerosol generation container 4 via pipe 6, high-pressure gas cylinder 1 to accumulate a carrier gas, aerosol generation container 4 in which particle raw material 12 and the carrier gas transferred via pipe 2 are stirred to be mixed, and valves 3 and 5. A temperature control system with a peltiert element is placed on the back surface of the stage to keep the substrate in optimum temperature.

Further, the particle raw material in the aerosol generation container is formed on the blue LED as a substrate by the following procedures.

The raw material particle filled in the aerosol generation container has a preferable particle diameter of 0.02-5 μm, or a more preferable particle diameter of 0.1-2 μm. The particle raw material passes through the pipe to the aerosol generation container from the high-pressure gas cylinder with the accumulated carrier gas, and the particle raw material together with the carrier gas is aerosolized via vibration while stirring.

In order to measure a particle diameter of the raw material particle, a conventional laser diffraction type particle size analyzer is employed. Specific examples of the laser diffraction type particle size analyzer include HELOS (manufactured by JEOL Ltd), Microtrac HRA (manufactured by Nikkiso Co., Ltd.), SALD-1100 (manufactured by Shimadzu Corp.) and Coulter Counter (manufactured by Coulter Corp.). Of these, Microtrac HRA is preferably employed.

The aerosolized particle raw material passes through the pipe, and the particle raw material together with the carrier gas is sprayed onto the substrate from the nozzle having a narrow opening in the chamber to form a coating layer. The chamber is evacuated by a vacuum pump or such, and a vacuum degree inside the chamber is arranged to be adjusted if desired. In the present invention, the vacuum degree is preferably 0.01-10000 Pa, and more preferably 0.1-1000 Pa. Further, a phosphor layer having a desired thickness is possible to be formed at the predetermined portion of the substrate, since the substrate holder can be moved by setting the XYZθ stage in 3 dimensional motion. A sealing layer can be formed on the prepared phosphor layer, if desired.

The aerosolized raw material particles are transported by a carrier gas having a flow speed of 100-400 m/sec, and deposited via collision with the substrate surface. The particles transported by the carrier gas are also bonded via impact caused by collision with each other to form a layer.

In the manufacturing method of the present invention, inert gas such as $N_2$ gas or He gas is preferable as a carrier gas to accelerate and spray the raw material particles, but $N_2$ gas is more preferably usable. In addition, the phosphor layer has preferably a thickness of 2-500 μm, and more preferably a thickness of 5-50 μm. the phosphor particle diameter is preferably 0.05-5 μm, more preferably 0.2-2μm, and still more preferably 0.2-1 μm.

In order to form a transparent layer capable of exhibiting sufficient luminance, it is preferred that a temperature of at least −100° C. and at most 200° C. is also maintained as a temperature of the substrate to collide the raw material particles with.

Particles of at least the foregoing phosphor are employed to form a phosphor layer, but the foregoing transparent inorganic oxide particles may also be mixed, if desired. The aerosol generation containers for the phosphor and additionally for the transparent inorganic oxide are installed in the foregoing film-forming apparatus, and a phosphor distribution in the phosphor layer may be controlled by changing one feed raw material to another appropriately. The phosphor concentration in the phosphor layer can be controlled by appropriately mixing a phosphor with a transparent inorganic oxide. In the case of forming only the transparent inorganic oxide layer on the outermost surface, it is usable as a transparent sealing layer. On the other hand, only the transparent inorganic oxide layer may be formed on the blue LED surface. It is also possible to form a layer composed of no transparent inorganic oxide, but only a phosphor. In addition, the white LED may contain other inorganic compounds such as a light diffusion material, an inorganic pigment and so forth.

A LED chip formed with a phosphor layer is fitted with a transparent resin cover made of a silicone resin or such, or a glass cover at the phosphor film-formed portion of the light emitting chip to complete a white LED. The rated direct current load up to a maximum voltage and current of 5 V and 30 mA, respectively, for example, is applied to a white LED of the present invention to emit light, whereby white light emission can be obtained.

EXAMPLE

Next, the present invention will now be described in detail referring to examples, however, the present invention is not limited thereto.

Example 1

An yellow phosphor layer was prepared employing an aerosol deposition film-forming apparatus as shown in FIG. 1. $(Y, Gd, Ce)_3Al_5O_{12}$ phosphor particles having a particle size distribution of 0.1-1 μm and an average particle diameter of 0.5 μm were filled in an aerosol generation container, and sprayed onto a blue LED chip (0.4 mm-square) having a light emission peak wavelength of 460 nm under the conditions of a chamber vacuum degree of 100 Pa and a substrate temperature of 20° C., employing $N_2$ gas with a flow rate of 200 m/s as a carrier gas to prepare a 10 μm thick film, whereby a white LED was obtained.

Example 2

Similarly to Example 1, $(Y, Gd, Ce)_3Al_5O_{12}$ phosphor particles were sprayed onto a blue LED chip (0.4 mm-square) having a light emission peak wavelength of 460 nm to prepare a 10 μm thick film. Further, $SiO_2$ particles having a particle size distribution of 0.1-1 μm and an average particle diameter of 0.5 μm were sprayed onto the above-described resulting sprayed surface under the same condition to prepare another 10 μm thick film, whereby a white LED shown in FIG. 2 was obtained.

Comparative Example

A mixture liquid in which $(Y, Gd, Ce)_3Al_5O_{12}$ phosphor was mixed with an epoxy resin (NT8014, produced by Nitto Denko Corp.) and an acid anhydride based hardener was prepared.

Fifty μl of the above mixture liquid of the phosphor and the resin was dripped onto a blue LED chip (0.4 mm-square) having a light emission peak wavelength of 460 nm, employing an injector, and after the resulting surface was dried, it was further covered by a half-circle-shaped transparent epoxy resin cover to obtain a white LED.

(Evaluation)

Each of white LEDs of Example 1, Example 2 and Comparative example was operated at 50° C. and 20 mA to determine the period of half decay, based on the initial light flux. The results are shown in Table 1.

| Sample | Period of half decay |
|---|---|
| Example 1 | 27,200 |
| Example 2 | 31,100 |
| Comparative example | 5,100 |

It is to be understood that a white LED exhibiting longer operating life can be provided in the present invention, as described above.

EFFECT OF THE INVENTION

At low cost, provided can be a white LED possessing a phosphor layer to convert blue light into yellow light, provided on a blue LED, wherein the phosphor layer possesses an inorganic compound containing a phosphor, which is prepared via an aerosol deposition method capable of high-speed film formation. A white LED manufactured via this method also exhibits high reliability and longer operating life.

What is claimed is:

1. A method of manufacturing a white light emitting diode comprising a transparent inorganic oxide, and a phosphor layer to convert blue light into yellow light, provided on a blue light emitting diode, the method comprising the steps of:

forming the phosphor layer comprising an inorganic compound containing a phosphor, and forming the transparent inorganic oxide as an oxide of at least one kind selected from Al, Si, Ti, Ge, P, B, Y, Sn, Pb, Gd, Lu, Sc, In, Mg, Ca, Sr and Ba via an aerosol deposition method by which particles in a vapor phase are deposited on a substrate via collision of the particles with a surface of the substrate in a vacuum.

2. The method of claim 1, wherein a compound as the phosphor being the inorganic compound is prepared.

3. The method of claim 1, wherein the transparent inorganic oxide being formed is silica or alumina.

4. The method of claim 1 comprising a film formation rate of 10-30 μm/min for the phosphor layer.

* * * * *